United States Patent [19]
Horie et al.

[11] Patent Number: 5,841,301
[45] Date of Patent: Nov. 24, 1998

[54] VALUABLE THRESHOLD WAVEFORM SHAPING APPARATUS

[75] Inventors: Masakiyo Horie, Toyohashi; Takuya Harada, Kariya, both of Japan

[73] Assignee: Nippondenso Co., Ltd., Kariya, Japan

[21] Appl. No.: 618,620

[22] Filed: Mar. 20, 1996

[30] Foreign Application Priority Data

Mar. 31, 1995 [JP] Japan .................. 7-076431

[51] Int. Cl.$^6$ ...................................... H03K 5/01
[52] U.S. Cl. .................. 327/100; 327/18; 327/37
[58] Field of Search .................. 327/100–102, 327/17, 18, 20, 31, 37, 23, 24, 47, 48, 49, 565, 563, 333, 378; 377/3, 20

[56] References Cited

U.S. PATENT DOCUMENTS

| | | | |
|---|---|---|---|
| 5,019,936 | 5/1991 | Zylstra et al. | 327/101 |
| 5,357,147 | 10/1994 | Ina et al. | 327/100 |
| 5,396,109 | 3/1995 | Oshiba | 327/100 |
| 5,406,132 | 4/1995 | Housako | 327/100 |
| 5,576,658 | 11/1996 | Hushimi et al. | 327/100 |

FOREIGN PATENT DOCUMENTS 59-137639  9/1984  Japan .
5-010197  1/1993  Japan .

*Primary Examiner*—Timothy P. Callahan
*Assistant Examiner*—My-Trang Nu Ton
*Attorney, Agent, or Firm*—Cushman, Darby & Cushman IP Group of Pillsbury Madison & Sutro LLP

[57] ABSTRACT

A waveform shaping apparatus includes a comparing device for comparing a sensor output signal with a threshold voltage to convert the sensor output signal into a waveform shaped signal. The comparing device outputs the waveform shaped signal. The waveform shaping apparatus also includes a frequency-to-voltage converting device for generating the threshold voltage in response to a frequency of the output signal from the comparing device. In the frequency-to-voltage converting device, a clock signal is generated in response to the output signal from the comparing device. The clock signal has a period proportional to a period of the output signal from the comparing device. A counting device is operative for counting pulses in the clock signal generated by the clock signal generating device for every given period, and outputting a signal representing a counted pulse number depending on the frequency of the output signal from the comparing device. A D/A converting device is operative for converting the output signal from the counting device into a voltage signal which depends on the counted pulse number. The threshold voltage is generated in response to the voltage signal generated by the D/A converting device.

7 Claims, 9 Drawing Sheets

10° 30° (TEETHLESS)
1b
1a

T  3T  T  T

TIME

FIG. 8
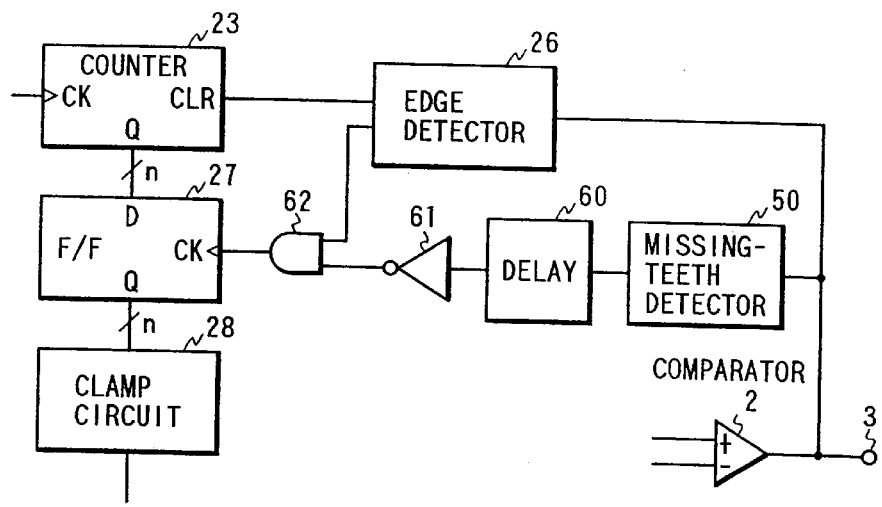
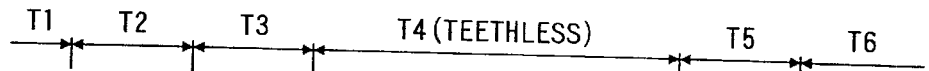
FIG. 9 (a)
FIG. 9 (b)
FIG. 9 (c)
FIG. 9 (d)
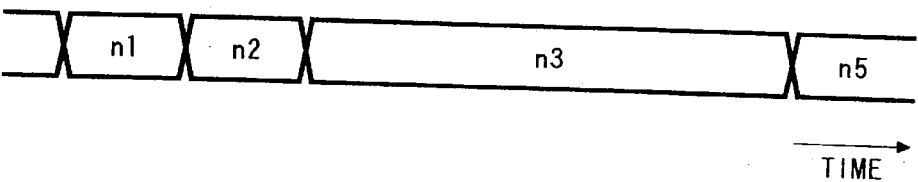
FIG. 9 (e)

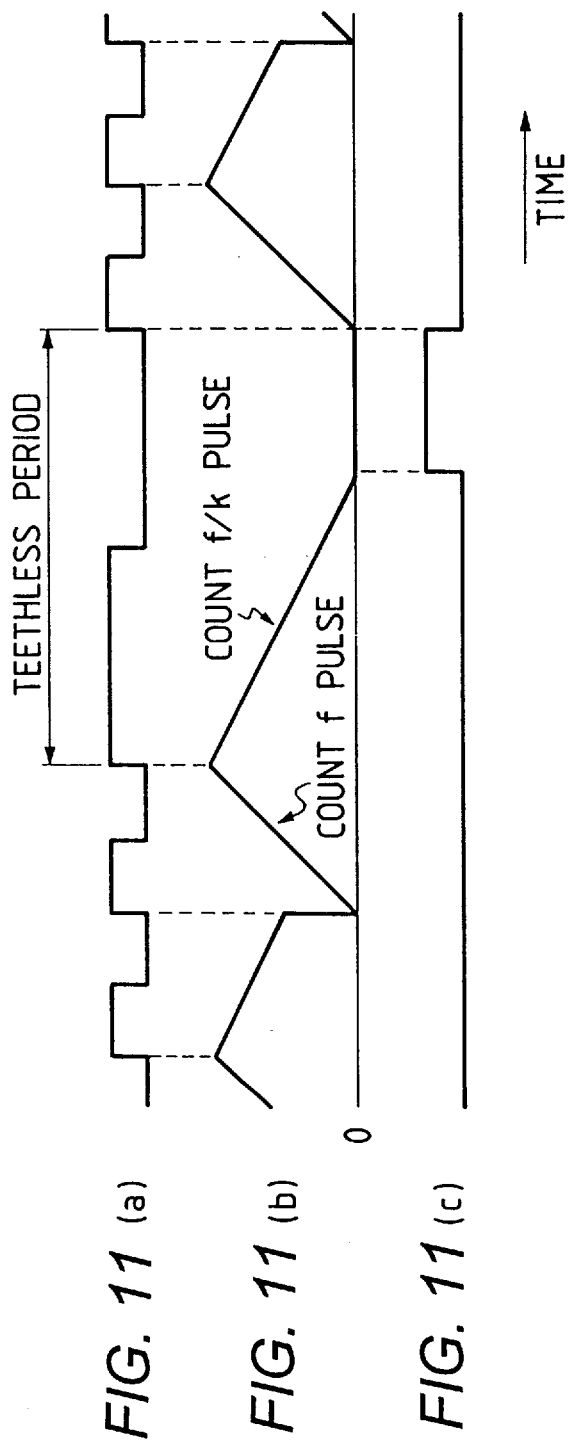

VALUABLE THRESHOLD WAVEFORM SHAPING APPARATUS

BACKGROUND OF THE INVENTION

1. Field of the Invention

This invention relates to an apparatus for shaping the waveform of an electric signal such as a sensor output signal.

2. Description of the Prior Art

Some of automotive engines are equipped with engine speed sensors or crank angle sensors. A known waveform shaping apparatus compares the voltage of the output signal of such a sensor with a threshold voltage, and thereby shapes the waveform of the output signal of the sensor into a binary form or a digital form.

The amplitude of such an engine-related sensor tends to increase as the engine speed rises. It is known to increase the threshold voltage in the waveform shaping apparatus in accordance with an increase in the engine speed. This design is to remove noise such as ignition noise from the binary version (the digital version) of the sensor output signal.

SUMMARY OF THE INVENTION

It is an object of this invention to provide an improved waveform shaping apparatus.

A first aspect of this invention provides a waveform shaping apparatus comprising a) comparing means for comparing a sensor output signal with a threshold voltage to convert the sensor output signal into a waveform shaped signal, and outputting the waveform shaped signal; and b) frequency-to-voltage converting means for generating the threshold voltage in response to a frequency of the output signal from the comparing means; wherein the frequency-to-voltage converting means comprises b1) clock signal generating means for generating a clock signal in response to the output signal from the comparing means, the clock signal having a period proportional to a period of the output signal from the comparing means; b2) first counting means for counting pulses in the clock signal generated by the clock signal generating means for every given period, and outputting a signal representing a counted pulse number depending on the frequency of the output signal from the comparing means; b3) D/A converting means for converting the output signal from the first counting means into a voltage signal which depends on the counted pulse number; and b4) means for generating the threshold voltage in response to the voltage signal generated by the D/A converting means.

A second aspect of this invention is based on the first aspect thereof, and provides a waveform shaping apparatus wherein the clock signal generating means comprises period measuring means for measuring a period of the output signal from the comparing means, and converting means for generating the clock signal in response to the period measured by the period measuring means.

A third aspect of this invention is based on the second aspect thereof, and provides a waveform shaping apparatus wherein the period measuring means comprises edge detecting means for detecting every edge in the output signal from the comparing means, second counting means for counting pulses in a fixed-frequency signal during a time interval between moments at which a last edge and an immediately preceding edge are detected by the edge detecting means respectively, the period measuring means being operative for measuring the period of the output signal from the comparing means in response to a counted pulse number related to the second counting means.

A fourth aspect of this invention is based on the third aspect thereof, and provides a waveform shaping apparatus wherein the period measuring means comprises averaging means for averaging a plurality of last counted pulse numbers related to the second counting means into an average counted pulse number, the period measuring means being operative for measuring the period of the output signal from the comparing means in response to the average counted pulse number.

A fifth aspect of this invention is based on the second aspect thereof, and provides a waveform shaping apparatus wherein the sensor output signal is generated in response to rotation of a rotatable member having teeth, and further comprising missing-teeth detecting means for detecting a teethless area of the member in response to the output signal from the comparing means, and means for inhibiting the period measured by the period measuring means from being updated when a teethless area is detected by the missing-teeth detecting means.

A sixth aspect of this invention is based on the second aspect thereof, and provides a waveform shaping apparatus wherein the converting means comprises third counting means for counting pulses in a fixed-frequency signal having a period shorter than the given period, and means for comparing the period measured by the period measuring means and a counted pulse number related to the third counting means to generate the clock signal.

A seventh aspect of this invention provides a waveform shaping apparatus comprising a) comparing means for comparing a sensor output signal with a threshold voltage to convert the sensor output signal into a waveform shaped signal, and outputting the waveform shaped signal; and b) frequency-to-voltage converting means for generating the threshold voltage in response to a frequency of the output signal from the comparing means; wherein the frequency-to-voltage converting means comprises b1) clock signal generating means for generating a clock signal in response to the output signal from the comparing means, the clock signal having a period proportional to a period of the output signal from the comparing means; b2) counting means for down-counting pulses in the clock signal generated by the clock signal generating means from an initial value for every given period, and outputting a signal representing a down-counted pulse number depending on the frequency of the output signal from the comparing means; b3) a D/A converting means for converting the output signal from the counting means into a voltage signal, the D/A converting means comprising means for generating a given reference voltage; b4) voltage-to-current converting means for converting a voltage difference between the voltage signal and the given reference voltage generated by the D/A converting means into a corresponding current signal; and b5) means for generating the threshold voltage in response to the current signal generated by the voltage-to-current converting means.

BRIEF DESCRIPTION OF THE DRAWINGS

FIG. 8 is a block diagram of a portion of a waveform shaping apparatus according to a fourth embodiment of this invention.

FIGS. 9(a)–9(e) are a time-domain diagram of signals in the waveform shaping apparatus of FIG. 8.

FIGS. 11(a)–11(c) are a time-domain diagram of signals and a parameter in the edge detector of FIG. 10.

DESCRIPTION OF THE PREFERRED EMBODIMENTS

A prior-art waveform shaping apparatus will be described hereinafter for a better understanding of this invention.

Figure 1:
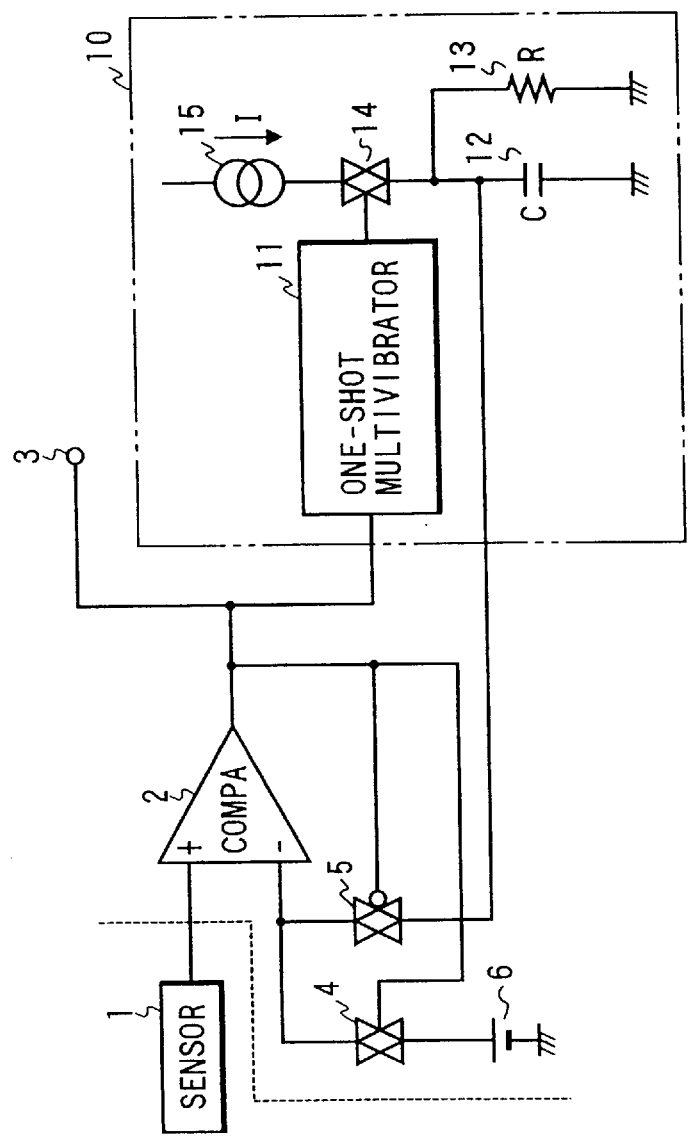
FIG. 1 is a diagram of a prior-art waveform shaping apparatus.

With reference to FIG. 1, a prior-art waveform shaping apparatus follows a sensor 1 outputting an analog signal. The prior-art waveform shaping apparatus includes a comparator 2. The non-inverting input terminal of the comparator 2 receives the output signal of the sensor 1. The inverting input terminal of the comparator 2 is subjected to a threshold voltage. The device 2 compares the voltage of the output signal of the sensor 1 with the threshold voltage, thereby shaping the waveform of the output signal of the sensor 1 into a binary form or a digital form. Thus, the comparator 2 converts the output signal of the sensor 1 into a corresponding binary signal or a corresponding digital signal. The comparator 2 outputs the resultant binary signal (the resultant digital signal). The binary signal is transmitted from the comparator 2 to an external device (not shown) via an output terminal 3.

Specifically, the output signal of the comparator 2 changes from a low-level state to a high-level state when the voltage of the output signal of the sensor 1 rises across the threshold voltage. The output signal of the comparator 2 changes from the high-level state to the low-level state when the voltage of the output signal of the sensor 1 drops across the threshold voltage.

The prior-art waveform shaping apparatus of FIG. 1 includes analog switches 4 and 5 connected to the inverting input terminal of the comparator 2. The analog switches 4 and 5 are turned on and off (closed and opened) in response to the output signal of the comparator 2. The analog switch 4 is connected to a constant voltage source 6 for generating a constant voltage. The analog switch 5 is connected to a frequency-to-voltage converter (an F/V converter) 10.

When the output signal of the comparator 2 is in a high-level state, the analog switch 4 is in its on state and the analog switch 5 is in its off state. Accordingly, in this case, the constant voltage across the constant voltage source 6 is applied via the analog switch 4 to the inverting input terminal of the comparator 2 as the threshold voltage. When the output signal of the comparator 2 is in a low-level state, the analog switch 4 is in its off state and the analog switch 5 is in its on state. Accordingly, in this case, the output signal of the F/V converter 10 is applied via the analog switch 5 to the inverting input terminal of the comparator 2 as the threshold voltage.

In the prior-art waveform shaping apparatus of FIG. 1, the F/V converter 10 includes a one-shot multivibrator 11 which responds to the output signal of the comparator 2. The one-shot multivibrator 11 outputs a pulse of a given width in response to each rising edge in the output signal of the comparator 2. The output signal of the one-shot multivibrator 11 is applied to the control terminal of an analog switch 14. A constant current source 15 is connected via the analog switch 14 to a capacitor 12. A resistor 13 is connected in parallel with the capacitor 12. When a pulse in the output signal of the one-shot multivibrator 11 occurs, the analog switch 14 is in its on state so that a constant current I flows from the constant current source 15 into the capacitor 12 via the analog switch 14. Thus, in this case, the capacitor 12 is charged by the constant current I. In the absence of a pulse in the output signal of the one-shot multivibrator 11, the analog switch 14 is in its off state so that the capacitor 12 is disconnected from the constant current source 15.

Thus, in this case, the capacitor 12 is discharged through the resistor 13. The voltage across the capacitor 12 is fed to the analog switch 5 as the output signal of the F/V converter 10.

In the prior-art waveform shaping apparatus of FIG. 1, the voltage of the output signal of the F/V converter 10 increases as the frequency of the output signal of the comparator 2 (that is, the frequency of the output signal of the sensor 1) rises. As previously described, the output signal of the F/V converter 10 is applied to the comparator 2 as the threshold voltage when the output signal of the comparator 2 is in the low-level state. On the other hand, the threshold voltage applied to the comparator 2 is provided by the constant voltage source 6 when the output signal of the comparator 2 is in the high-level state.

There is a hysteresis which corresponds to the difference between the threshold voltage provided by the constant source voltage 6 and the threshold voltage provided by the F/V converter 10. Since the voltage of the output signal of the F/V converter 10 increases as the frequency of the output signal of the sensor 1 rises, the hysteresis depends on the frequency of the output signal of the sensor 1.

In the prior-art waveform shaping apparatus of FIG. 1, the F/V converter 10 is of the analog type so that the threshold voltage provided by the F/V converter 10 tends to be affected by the parameters of parts or elements composing the F/V converter 10.

Generally, the time constant decided by the capacitance C of the capacitor 12 and the resistance R of the resistor 13 is set to several tens of milliseconds or longer. Accordingly, the threshold voltage provided by the F/V converter 10 can not quickly follow an abrupt change in the frequency of the output signal of the sensor 1. Since the capacitance C of the capacitor 12 and the resistance R of the resistor 13 generally depend on the temperatures thereof, the threshold voltage provided by the F/V converter 10 has a certain temperature dependency.

First Embodiment

Figure 2:
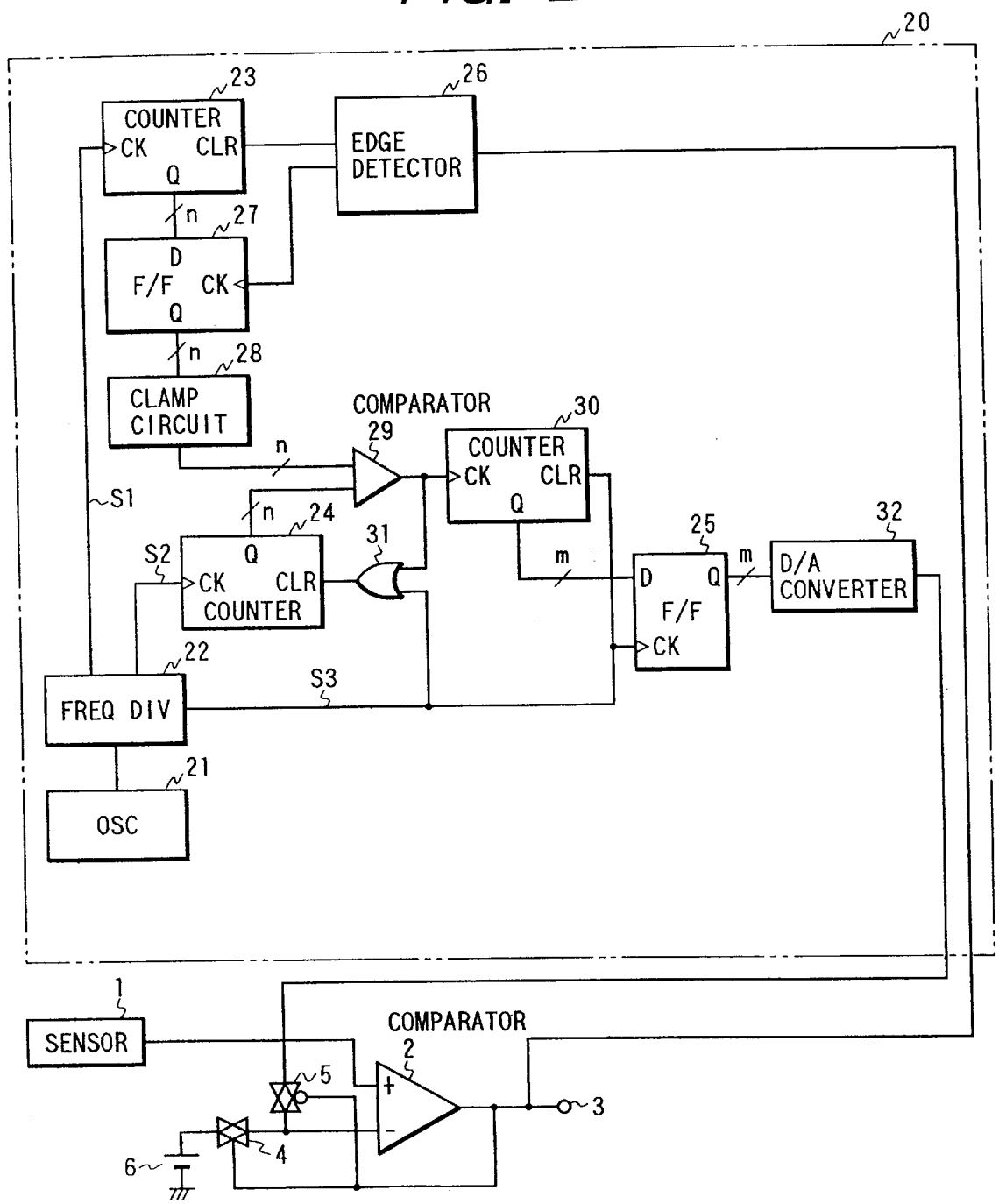
FIG. 2 is a block diagram of a waveform shaping apparatus according to a first embodiment of this invention.

With reference to FIG. 2, a waveform shaping apparatus follows a sensor 1 outputting an analog signal. The sensor 1 is, for example, a rotational engine speed sensor or a crank angle sensor outputting an analog signal having a frequency depending on a rotational engine speed.

The waveform shaping apparatus of FIG. 2 includes a comparator 2. The non-inverting input terminal of the comparator 2 receives the output signal of the sensor 1. The inverting input terminal of the comparator 2 is subjected to a threshold voltage. The device 2 compares the voltage of the output signal of the sensor 1 with the threshold voltage, thereby shaping the waveform of the output signal of the sensor 1 into a binary form or a digital form. Thus, the comparator 2 converts the output signal of the sensor 1 into a corresponding binary signal or a corresponding digital signal. The comparator 2 outputs the resultant binary signal (the resultant digital signal). The binary signal is transmitted from the comparator 2 to an external device (not shown) via an output terminal 3.

Specifically, the output signal of the comparator 2 changes from a low-level state to a high-level state when the voltage of the output signal of the sensor 1 rises across the threshold voltage. The output signal of the comparator 2 changes from the high-level state to the low-level state when the voltage of the output signal of the sensor 1 drops across the threshold voltage.

The waveform shaping apparatus of FIG. 2 includes analog switches 4 and 5 connected to the inverting input terminal of the comparator 2. The analog switches 4 and 5 are turned on and off (closed and opened) in response to the output signal of the comparator 2. The analog switch 4 is connected to a constant voltage source 6 for generating a constant voltage. The analog switch 5 is connected to a frequency-to-voltage converter (an F/V converter) 20.

When the output signal of the comparator 2 is in a high-level state, the analog switch 4 is in its on state and the analog switch 5 is in its off state. Accordingly, in this case, the constant voltage across the constant voltage source 6 is applied via the analog switch 4 to the inverting input terminal of the comparator 2 as the threshold voltage. When the output signal of the comparator 2 is in a low-level state, the analog switch 4 is in its off state and the analog switch 5 is in its on state. Accordingly, in this case, the output signal of the F/V converter 20 is applied via the analog switch 5 to the inverting input terminal of the comparator 2 as the threshold voltage.

As shown in FIG. 2, the F/V converter 20 includes an oscillator 21 having a quartz-crystal resonator. The oscillator 21 is preferably of the temperature-compensated type. The oscillator 21 outputs a signal having a preset frequency. The oscillator 21 is followed by frequency dividers 22. The devices 22 subject the output signal of the oscillator 21 to frequency dividing processes, thereby converting the output signal of the oscillator 21 into signals S1, S2, and S3 having given frequencies and given periods respectively. The frequency dividers 22 output these signals S1, S2, and S3. The frequency-divider output signal S1 is fed to an n-bit counter 23, where "n" denotes a given natural number. Pulses in the signal S1 are counted by the counter 23. The frequency-divider output signal S2 is fed to an n-bit counter 24. Pulses in the signal S2 are counted by the counter 24. The frequency-divider output signal S3 is used to provide a timing of the latching by a D-type flip flop (D-F/F) 25 or a timing of the updating of the threshold voltage. The period of the frequency-divider output signal S1 is longer than the period of the frequency-divider output signal S2 and is shorter than the period of the frequency-divider output signal S3. For example, the periods of the frequency-divider output signals S1, S2, and S3 are equal to 64 $\mu$sec, 2 $\mu$sec, and 7,040 $\mu$sec respectively.

In the case where the period of the output signal of the comparator 2 is shorter than that in this embodiment, the period of the frequency-divider output signal S1 is sometimes shorter than the period of the frequency-divider output signal S2.

The F/V converter 20 includes an edge detector 26 following the comparator 2. The device 26 detects every rising edge in the output signal of the comparator 2. The edge detector 26 is connected to the counter 23 and an n-bit D-type flip flop (D-F/F) 27. The counter 23 is followed by the D-type flip flop 27. The device 23 counts pulses in the frequency-divider output signal S1, generating and outputting a signal representing the counted pulse number. Upon the occurrence of every rising edge in the output signal of the comparator 2, the edge detector 26 enables the D-type flip flop 27 to latch the output signal of the counter 23. Immediately after the output signal of the counter 23 is latched by the D-type flip flop 27, the edge detector 26 resets the counter 23 to an initial state corresponding to a counted pulse number of "0". Accordingly, the counter output signal latched by the D-type flip flop 27 represents the number of pulses in the frequency-divider output signal S1 which occur during the time interval between the moments of the occurrence of the last rising edge and the immediately preceding rising edge in the output signal of the comparator 2. The D-type flip flop 27 outputs the latched pulse number signal to a clamp circuit or a limiter 28.

The clamp circuit (the limiter) 28 subjects the output signal of the D-type flip flop 27 to a limiting process, thereby making the output signal of the D-type flip flop 27 into a limiting-resultant signal. The clamp circuit (the limiter) 28 outputs the limiting-resultant signal. The pulse number represented by the output signal of the clamp circuit (the limiter) 28 is limited to within a range between a given upper limit value and a given lower limit value. The upper limit value is preset to correspond to a first given rotational engine speed, for example, 45 rpm, in consideration of the reliability of the output signal of the sensor 1. The lower limit value is preset to correspond to a second given rotational engine speed higher than the first given rotational engine speed in consideration of a noise margin. The second given rotational engine speed is equal to, for example, 900 rpm. This setting provides a sufficient noise margin related to the threshold voltage when the rotational engine speed is equal to 900 rpm or higher. It should be noted that the pulse number represented by the output signal of the D-type flip flop 27 decreases as the rotational engine speed increases. Also, the limiting process by the clamp circuit (the limiter) 28 prevents a counter 30 in a later stage from overflowing.

The device 24 counts pulses in the frequency-divider output signal S2, generating and outputting a signal representing the counted pulse number. A first input terminal of a digital comparator 29 receives the output signal of the clamp circuit (the limiter) 28. A second input terminal of the digital comparator 29 receives the output signal of the counter 24. The output terminal of the digital comparator 29 is connected to the clock terminal of the counter 30. The output terminal of the digital comparator 29 is also connected to the clear terminal of the counter 24 via an OR gate 31. The frequency-divider output signal S3 is transmitted via the OR gate 31 to the clear terminal of the counter 24. The device 29 compares the pulse numbers represented by the output signals of the clamp circuit (the limiter) 28 and the counter 24. When the pulse number represented by the output signal of the counter 24 reaches the pulse number represented by the output signal of the clamp circuit (the limiter) 28, the digital comparator 29 outputs a positive-going voltage change (a low-to-high voltage change). The positive-going voltage change (the low-to-high voltage change) travels to the clear terminal of the counter 24 via the OR gate 31, and clears or resets the counter 24 to an initial state corresponding to a counted pulse number of "0". As understood from the previous description, the digital comparator 29 outputs a pulse each time the pulse number represented by the output signal of the counter 24 reaches the pulse number represented by the output signal of the clamp circuit (the limiter) 28. The counter 24 is also cleared or reset in response to the frequency-divider output signal S3.

The counter 30 following the digital comparator 29 is of an m-bit type, where "m" denotes a given natural number. The device 30 up-counts pulses outputted from the digital comparator 29, and generates and outputs a signal representing the counted pulse number. The counter 30 is followed by the D-type flip flop (D-F/F) 25 of an m-bit type. The clock terminal of the D-type flip flop 25 and the clear terminal of the counter 30 are subjected to the frequency-divider output signal S3. The D-type flip flop 25 latches the output signal of the counter 30 (the pulse number signal outputted from the counter 30) at a timing of the occurrence of every rising edge in the frequency-divider output signal S3. Immediately after the output signal of the counter 30 (the pulse number signal outputted from the counter 30) is latched by the D-type flip flop 25, the counter 30 is cleared or reset by the frequency-divider output signal S3 to an initial state corresponding to a counted pulse number of "0". The D-type flip flop 25 outputs the latched pulse number signal to a D/A (digital-to-analog) converter 32. The D/A converter 32 changes the output signal of the D-type flip flop 25 into a corresponding analog voltage signal. The D/A converter 32 outputs the resultant analog voltage signal to the analog switch 5. When the analog switch 5 is in its on state, the output signal of the D/A converter 32 is applied to the comparator 2 via the analog switch 5 as the threshold voltage.

Figure 3:
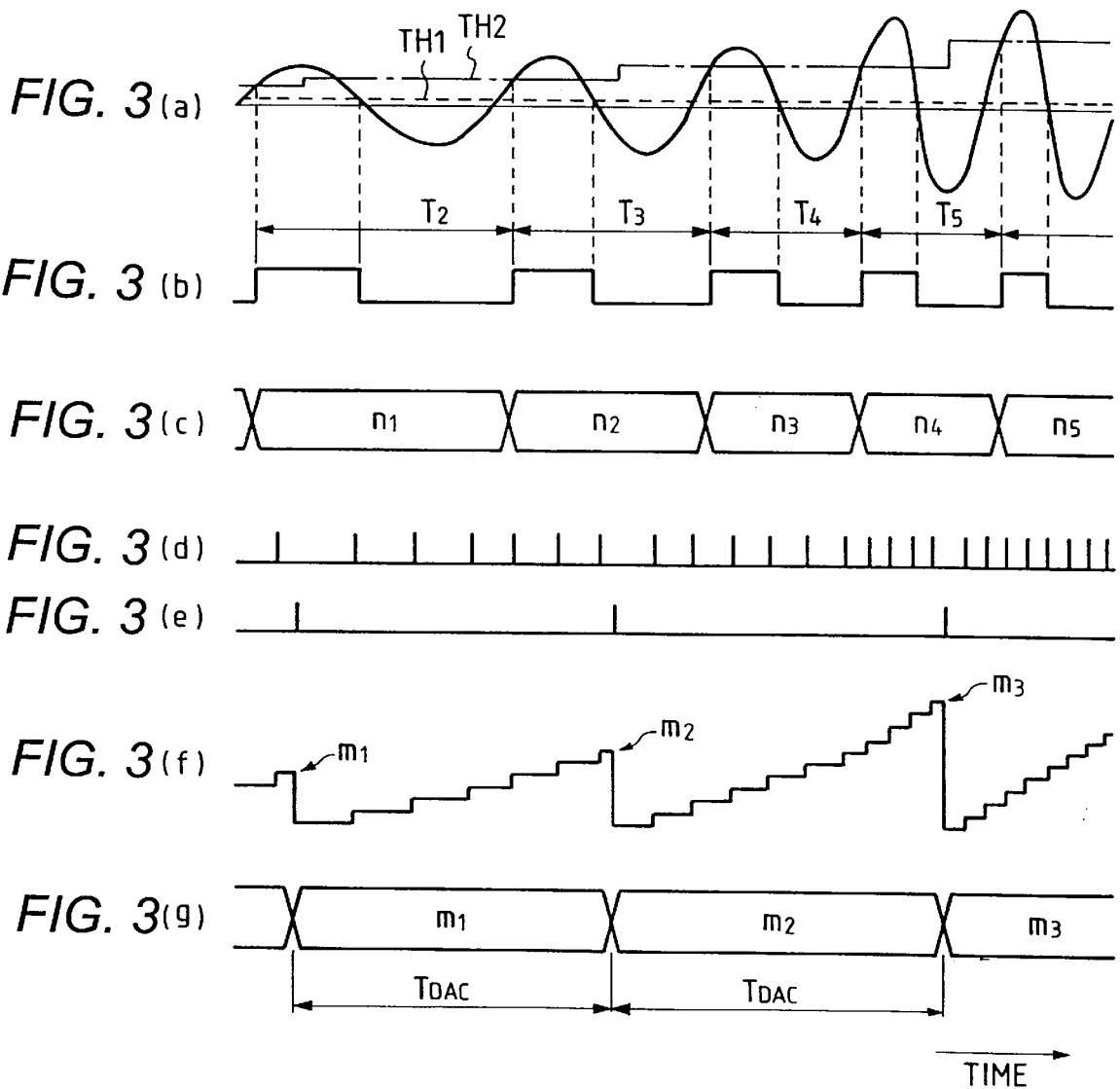
FIGS. 3(a)–3(g) are a time-domain diagram of signals and parameters in the waveform shaping apparatus of FIG. 2.

FIG. 3(a) shows an example of the waveform of the output signal from the sensor 1. With reference to FIG. 3(a), the frequency of the output signal from the sensor 1 increases as time goes by since the rotational engine speed rises. As previously described, the voltage of the output signal from the sensor 1 is compared with the threshold voltage by the comparator 2. In FIG. 3(a), the broken line TH1 denotes the threshold voltage provided by the constant voltage source 6, and the dot-dash line TH2 denotes the threshold voltage provided by the F/V converter 20. The threshold voltage TH1 provided by the constant voltage source 6 remains fixed. On the other hand, the threshold voltage TH2 provided by the F/V converter 20 increases as the frequency of the output signal from the sensor 1 rises. As previously described, one of the voltage generated by the constant voltage source 6 and the voltage generated by the F/V converter 20 is selected as the threshold voltage by the analog switches 4 and 5.

FIG. 3(b) shows an example of the waveform of the output signal from the comparator 2. With reference to FIG. 3(a) and FIG. 3(b), the output signal from the comparator 2 changes from a low-level state to a high-level state each time the voltage of the output signal from the sensor 1 increases across the threshold voltage TH2 provided by the F/V converter 20. The output signal from the comparator 2 changes from the high-level state to the low-level state each time the voltage of the output signal from the sensor 1 drops across the threshold voltage TH1 provided by the constant voltage source 6.

As previously described, every rising edge in the output signal of the comparator 2 is detected by the edge detector 26. Upon the detection of every rising edge in the output signal of the comparator 2, the pulse number signal generated by the counter 23 is latched by the D-type flip flop 27. Accordingly, the output signal of the D-type flip flop 27 is updated each time a rising edge in the output signal of the comparator 2 occurs. Thus, the pulse number represented by the output signal of the D-type flip flop 27 is renewed each time a rising edge in the output signal of the comparator 2 occurs. With reference to the portion (c) of FIG. 3, the pulse number represented by the output signal of the D-type flip flop 27 changes as "n1", "n2", "n3", "n4", and "n5" in response to rising edges in the output signal of the comparator 2. As previously described, the pulse number represented by the output signal of the D-type flip flop 27 is equal to the number of pulses in the frequency-divider output signal S1 which occur during the time interval between the moments of the occurrence of the last rising edge and the immediately preceding rising edge in the output signal of the comparator 2. With reference FIG. 3(a) and FIG. 3(b) the pulse numbers n2, n3, n4, and n5 correspond to the time intervals T2, T3, T4, and T5 between the moments of the occurrence of rising edges in the output signal of the comparator 2, respectively. Specifically, the pulse numbers n2, n3, n4, and n5 indicate the lengths of the time intervals T2, T3, T4, and T5 respectively.

As previously described, the clamp circuit (the limiter) 28 subjects the output signal of the D-type flip flop 27 to the limiting process, thereby making the output signal of the D-type flip flop 27 into the limiting-resultant signal. The clamp circuit (the limiter) 28 outputs the limiting-resultant signal. The pulse number represented by the output signal of the clamp circuit (the limiter) 28 is limited to within the given range.

As previously described, the device 24 counts pulses in the frequency-divider output signal S2, generating and outputting a signal representing the counted pulse number. The device 29 compares the pulse numbers represented by the output signals of the clamp circuit (the limiter) 28 and the counter 24. When the pulse number represented by the output signal of the counter 24 reaches the pulse number represented by the output signal of the clamp circuit (the limiter) 28, the digital comparator 29 outputs a positive-going voltage change (a low-to-high voltage change). The positive-going voltage change (the low-to-high voltage change) travels to the clear terminal of the counter 24 via the OR gate 31, and clears or resets the counter 24 to an initial state corresponding to a counted pulse number of "0". FIG. 3(d) shows an example of the waveform of the output signal of the digital comparator 29. With reference to FIG. 3(d), the digital comparator 29 outputs a pulse each time the pulse number represented by the output signal of the counter 24 reaches the pulse number represented by the output signal of the clamp circuit (the limiter) 28. The counter 24 is also cleared or reset in response to the frequency-divider output signal S3.

As previously described, the device 30 up-counts pulses outputted from the digital comparator 29, and generates and outputs a signal representing the counted pulse number. The D-type flip flop 25 latches the output signal of the counter 30 (the pulse number signal outputted from the counter 30) at a timing of the occurrence of every rising edge in the frequency-divider output signal S3. Immediately after the output signal of the counter 30 (the pulse number signal outputted from the counter 30) is latched by the D-type flip flop 25, the counter 30 is cleared or reset by the frequency-divider output signal S3 to an initial state corresponding to a counted pulse number of "0". At the same time, the counter 24 is cleared or reset by the frequency-divider output signal S3 to an initial state corresponding to a counted pulse number of "0". The frequency-divider output signal S3 has a waveform such as shown in FIG. 3(e).

FIG. 3(f) indicates the pulse number represented by the output signal of the counter 30. With reference to FIG. 3(d), FIG. 3(e) and FIG. 3(f), the pulse number represented by the output signal of the counter 30 is incremented by "1" in response to every pulse in the output signal of the digital comparator 29. The pulse number represented by the output signal of the counter 30 is reset to "0" by every pulse in the frequency-divider output signal S3. The output signal of the counter 30 is latched by the D-type flip flop 25 immediately before being reset. With reference to FIG. 3(f), the pulse number represented by the output signal of the counter 30 immediately before the resetting of the counter 30 changes as "m1", "m2", and "m3". Therefore, as shown in FIG. 3(g), the pulse number represented by the output signal of the D-type flip flop 25 changes from m1 to m3 through m2. The pulse number represented by the output signal of the D-type flip flop 25 is iteratively updated at a given period $T_{dac}$ equal to the period of the frequency-divider output signal S3.

The D/A converter 32 changes the output signal of the D-type flip flop 25 into a corresponding analog voltage signal. The D/A converter 32 outputs the resultant analog voltage signal to the analog switch 5. Thus, the voltage of the output signal of the D/A converter 32 depends on the pulse number represented by the output signal of the D-type flip flop 25. When the analog switch 5 is in its on state, the output signal of the D/A converter 32 is applied to the comparator 2 as the threshold voltage. The voltage of the output signal of the D/A converter 32 varies as shown by the dot-dash line TH2 in FIG. 3(a).

The pulse number represented by the output signal of the D-type flip flop 27 is proportional to the period of the output signal of the comparator 2. The period of the output signal of the digital comparator 29 is proportional to a value "N·T" where N denotes the pulse number represented by the output signal of the clamp circuit (the limiter) 28 and T denotes the period of the frequency-divider output signal S2. In the case where the pulse number represented by the output signal of the D-type flip flop 27 is in the range provided by the clamp circuit (the limiter) 28, since the pulse number represented by the output signal of the clamp circuit (the limiter) 28 is proportional to the period of the output signal of the comparator 2, the period of the output signal of the digital comparator 29 is also proportional to the period of the output signal of the comparator 2.

During every period of the frequency-divider output signal S3, pulses in the output signal of the digital comparator 29 is counted by the device 30. At an end of every period of the frequency-divider output signal S3, the output signal of the counter 30 is latched by the D-type flip flop 25. The period of the frequency-divider output signal S3 is denoted by the character $T_{dac}$ in FIG. 3(g). Normally, the pulse number represented by the output signal of the D-type flip flop 25 is inversely proportional to the period of the output signal of the comparator 2. In other words, the pulse number represented by the output signal of the D-type flip flop 25 is proportional to the frequency of the output signal of the comparator 2. Accordingly, the voltage of the output signal of the D/A converter 32 is proportional to the frequency of the output signal of the comparator 2. In this way, the F/V converter 20 implements frequency-to-voltage conversion.

The period of the output signal of the digital comparator 29 is determined by the period of the output signal of the comparator 2. Therefore, the pulse number represented by the D-type flip flop 25 reflects a mean value (an average value) of the period of the output signal of the comparator 2 which occurs during the latest time interval $T_{dac}$. Thus, a time lag or a delay time of a change of the threshold voltage TH2 in response to a variation in the frequency of the output signal of the comparator 2 is equal to or shorter than the time interval $T_{dac}$. The time interval $T_{dac}$ is equal to, for example, 7,040 μsec, that is, about 7 msec, Accordingly, the threshold voltage TH2 can quickly follow an abrupt change in the frequency of the output signal of the comparator 2 (that is, an abrupt change in the frequency of the output signal of the sensor 1 or an abrupt change in the rotational engine speed). In the prior-art waveform shaping apparatus of FIG. 1, when the capacitance C of the capacitor 12 is equal to 2.2 μF and the resistance R of the resistor 13 is equal to 20 KΩ, the time constant provided by the capacitor 12 and the resistor 13 is equal to 44 msec. Thus, regarding the prior-art waveform shaping apparatus of FIG. 1, a time lag or a delay time of a change of the threshold voltage in response to a variation in the frequency of the output signal of the comparator 2 corresponds to a time interval of 44 msec in the case of the previously-indicated setting of the capacitance C of the capacitor 12 and the resistance R of the resistor 13.

The output signal of the comparator 2 is transmitted via the output terminal 3 to an external device (not shown) such as an electronic control unit. For example, every falling edge (every negative-going edge) in the output signal of the comparator 2 is used by the electronic control unit as a reference for a spark timing.

Generally, the accuracy of the threshold voltage applied to the comparator 2 is determined by the accuracy of the D/A converter 32, the accuracy of an offset voltage related to the comparator 2, and the accuracy of the voltage generated by the constant voltage source 6. To suppress or remove temperature dependence, it is preferable that the D/A converter 32 is of the type including a resistor ladder. In addition, it is preferable that the constant voltage source 6 is of the type including a voltage divider formed by resistors. Furthermore, it is preferable that the waveform shaping apparatus of FIG. 2 is composed of a CMOS IC or CMOS IC's.

The counters 23, 24. and 30, the D-type flip flops 25 and 27, the D/A converter 32, and other devices in the F/V converter 20 can be formed by an IC including CMOS transistors. The waveform shaping apparatus of FIG. 2, a CPU in an electronic control unit for an engine, and other parts can be made into a single IC chip. In this case, the output signal of the oscillator 21 may be replaced by a system clock signal used in the CPU.

Second Embodiment

Figure 4:
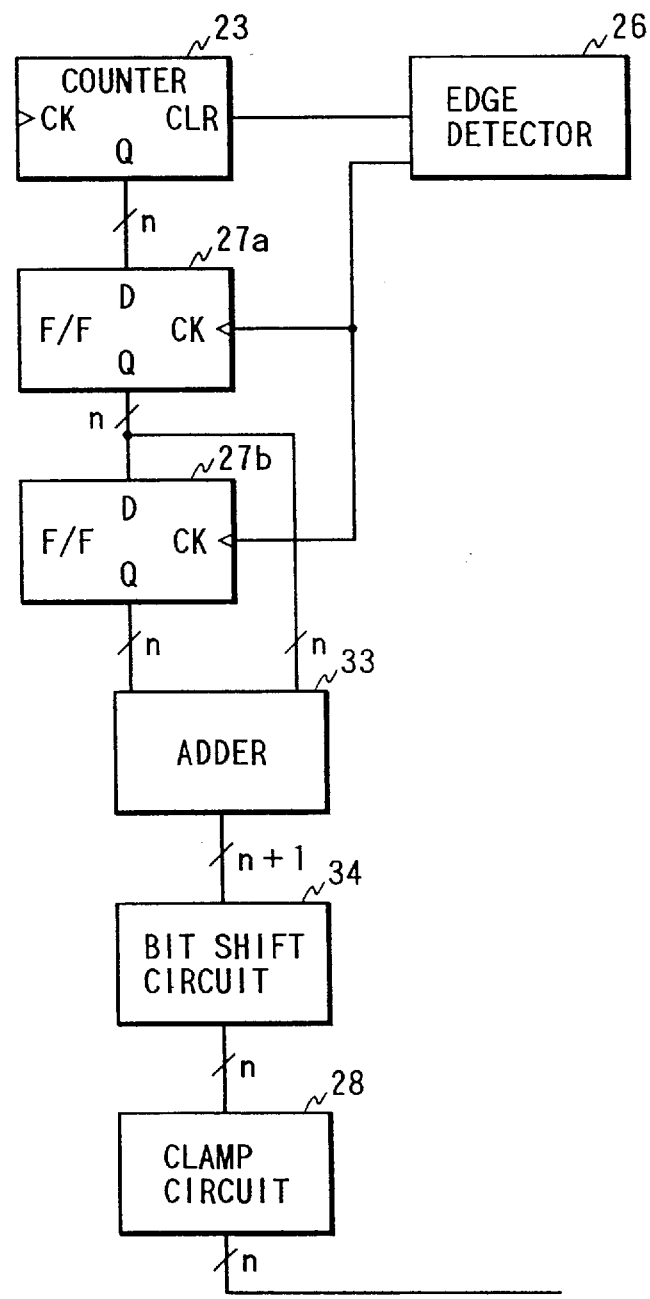
FIG. 4 is a block diagram of a portion of a waveform shaping apparatus according to a second embodiment of this invention.

FIG. 4 shows a portion of a second embodiment of this invention which is similar to the embodiment of FIGS. 2 and 3(a)-3(g) except for design changes indicated hereinafter.

In the embodiment of FIG. 4, an edge detector 26 is connected to a counter 23 and n-bit D-type flip flops (D-F/F) 27a and 27b. The counter 23 is sequentially followed by the D-type flip flop 27a and the D-type flip flop 27b. The output terminal of the D-type flip flop 27a is connected to the input terminal of the D-type flip flop 27b and also a first input terminal of an adder 33. The output terminal of the D-type flip flop 27b is connected to a second input terminal of the adder 33. The adder 33 is sequentially followed by a bit shift circuit 34 and a clamp circuit (a limiter) 28.

The device 23 counts pulses in a frequency-divider output signal S1 (see FIG. 2), generating and outputting a signal representing the counted pulse number. Upon the occurrence of every rising edge in the output signal of a comparator 2 (see FIG. 2), the edge detector 26 enables the D-type flip flop 27a to latch the output signal of the counter 23. Immediately after the output signal of the counter 23 is latched by the D-type flip flop 27a, the edge detector 26 resets the counter 23 to an initial state corresponding to a counted pulse number of "0". Accordingly, the counter output signal latched by the D-type flip flop 27a represents the number of pulses in the frequency-divider output signal S1 (see FIG. 2) which occur during the time interval between the moments of the occurrence of the last rising edge and the immediately preceding rising edge in the output signal of the comparator 2 (see FIG. 2). The D-type flip flop 27a outputs the latched pulse number signal to the D-type flip flop 27b and the adder 33.

Upon the occurrence of every rising edge in the output signal of the comparator 2 (see FIG. 2), the edge detector 26 enables the D-type flip flop 27b to latch the output signal of the D-type flip flop 27b. The D-type flip flop 27b outputs the latched signal to the adder 33. The output signal of the D-type flip flop 27a represents the latest counted pulse number while the output signal of the D-type flip flop 27b represents the immediately-preceding counted pulse number. The adder 33 combines the output signals of the D-type flip flops 27a and 27b, thereby adding the pulse numbers represented by the output signals of the D-type flip flops 27a and 27b. The adder 33 generates and outputs a signal representing the result of the addition of the pulse numbers. The bit shift circuit 34 following the adder 33 shifts the output signal of the adder 33 toward an LSB side by one bit, thereby dividing the pulse number, represented by the output signal of the adder 33, by two. The bit shift circuit 34 generates and outputs a signal representing the result of the division of the pulse number by two. In this way, the combination of the D-type flip flops 27a and 27b, the adder 33, and the bit shift circuit 34 serves to generate a signal representing a mean value (an average value) between the two last pulse numbers. The output signal of the bit shift circuit 34 is fed to the clamp circuit (the limiter) 28 before being processed thereby.

The embodiment of FIG. 4 may be modified to generate a signal representing a mean value (an average value) between the three or more last pulse numbers.

Third Embodiment

Figure 5:
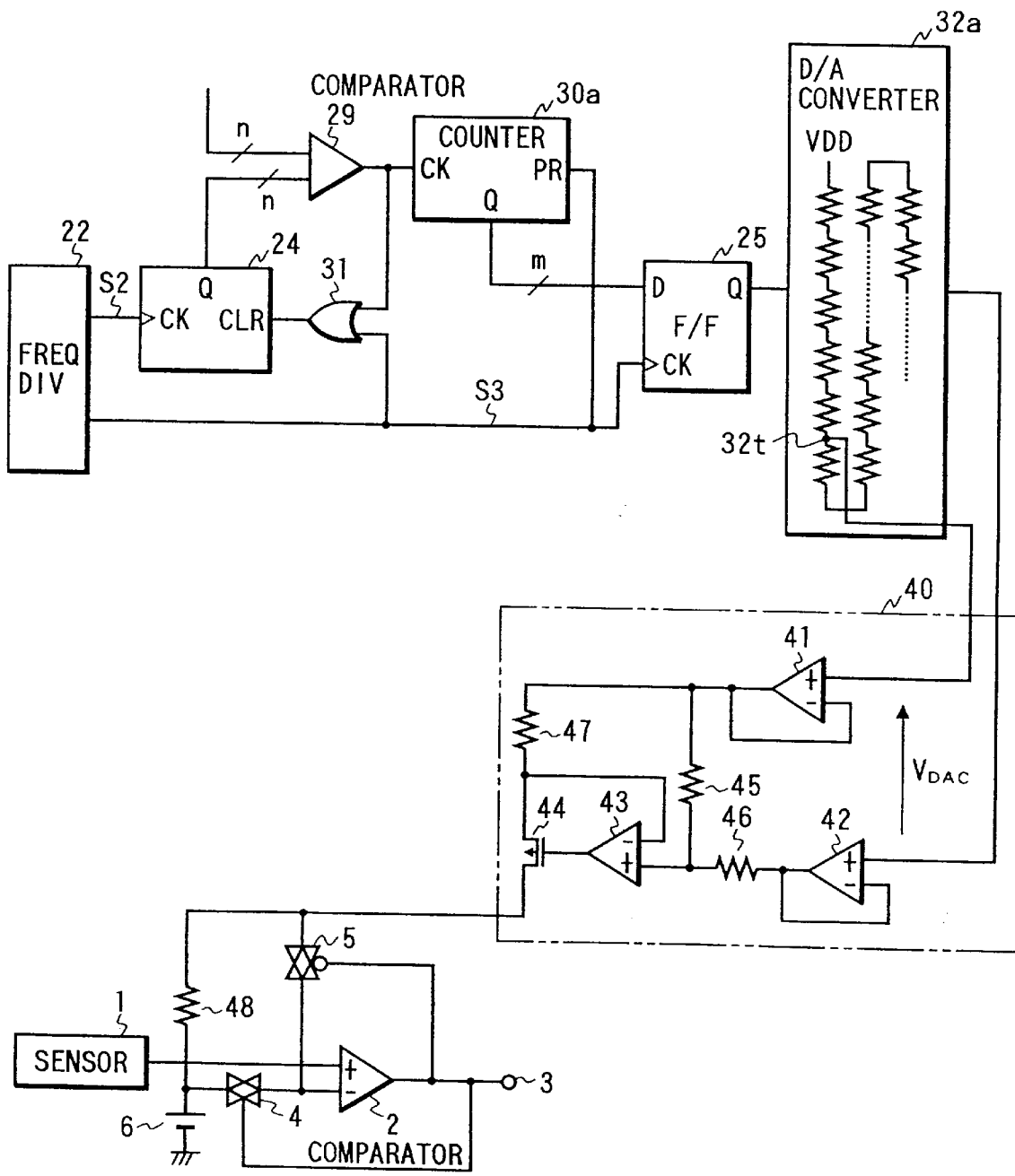
FIG. 5 is a diagram of a portion of a waveform shaping apparatus according to a third embodiment of this invention.

FIG. 5 shows a portion of a third embodiment of this invention which is similar to the embodiment of FIGS. 2 and 3(a)–3(g) or the embodiment of FIG. 4 except for design changes indicated hereinafter.

In the embodiment of FIG. 5, the output terminal of a digital comparator 29 is connected to the clock terminal of a counter 30a. The counter 30a is of an m-bit down-count type, where "m" denotes a given natural number. The device 30a down-counts pulses outputted from the digital comparator 29, and generates and outputs a signal representing the counted pulse number. The counter 30a is followed by a D-type flip flop (D-F/F) 25 of an m-bit type. The clock terminal of the D-type flip flop 25 and the preset terminal of the counter 30a are subjected to a frequency-divider output signal S3. The D-type flip flop 25 latches the output signal of the counter 30a (the pulse number signal outputted from the counter 30a) at a timing of the occurrence of every rising edge in the frequency-divider output signal S3. Immediately after the output signal of the counter 30a (the pulse number signal outputted from the counter 30a) is latched by the D-type flip flop 25, the counter 30a is preset by the frequency-divider output signal S3 to an initial state corresponding to a given number. The D-type flip flop 25 outputs the latched pulse number signal to a D/A (digital-to-analog) converter 32a. The D/A converter 32a changes the output signal of the D-type flip flop 25 into a corresponding analog voltage signal. The D/A converter 32a outputs the resultant analog voltage signal to a voltage-to-current converter 40.

The D/A converter 32a includes a resistor ladder having a given tap 32t. A reference voltage developed at the tap 32t in the resistor ladder is transmitted from the D/A converter 32a to the voltage-to-current converter 40. Even when the pulse number represented by the output signal of a clamp circuit or a limiter 28 (see FIGS. 2 and 4) is fixed to the upper limit value of a range provided by the clamp circuit (the limiter) 28, the voltage of the analog signal outputted from the D/A converter 32a is lower than the reference voltage transmitted from the D/A converter 32a to the voltage-to-current converter 40.

The number of times of the execution of the down-counting by the counter 30a during one period of the signal S3 is inversely proportional to the period of the output signal of a comparator 2. A difference voltage $V_{dac}$ equal to the previously-indicated reference voltage minus the voltage of the analog signal outputted from the D/A converter 32a is pretendedly inversely proportional to the period of the output signal of the comparator 2. In other words, the difference voltage $V_{dac}$ is pretendedly proportional to the frequency of the output signal of the comparator 2. The difference voltage $V_{dac}$ is converted into a corresponding current by the device 40.

The voltage-to-current converter 40 includes buffers 41 and 42, an operational amplifier 43, a transistor 44, and resistors 45, 46, and 47. The non-inverting input terminal of the buffer 41 is subjected to the previously-indicated reference voltage fed from the D/A converter 32a. The inverting input terminal of the buffer 41 is connected to the output terminal thereof. The output terminal of the buffer 41 is connected to the non-inverting input terminal of the operational amplifier 43 via the resistor 45. The output terminal of the buffer 41 is connected to a first end of the source-drain path of the transistor 44 via the resistor 47. The non-inverting input terminal of the buffer 42 is subjected to the analog signal outputted from the D/A converter 32a. The inverting input terminal of the buffer 42 is connected to the output terminal thereof. The output terminal of the buffer 42 is connected to the non-inverting input terminal of the operational amplifier 43 via the resistor 46. The inverting input terminal of the operational amplifier 43 is connected to the junction between the resistor 47 and the transistor 44. The output terminal of the operational amplifier 43 is connected to the gate of the transistor 44. A second end of the source-drain path of the transistor 44 is connected to an analog switch 5. The second end of the source-drain path of the transistor 44 is connected via a resistor 48 to the junction between an analog switch 4 and a constant voltage source 6.

A current $I_{dac}$ which flows through the source-drain path of the transistor 44 is proportional to the previously-indicated difference voltage $V_{dac}$. Specifically, the current $I_{dac}$ is given as "$I_{dac} = V_{dac} \cdot R1/\{R3 \cdot (R1+R2)\}$" where R1, R2, and R3 denote the resistances of the resistors 45, 46, and 47 respectively. The current $I_{dac}$ which flows through the source-drain path of the transistor 44 is outputted from the voltage-to-current converter 40 before flowing through the resistor 48. When the analog switch 4 is in its off state and the analog switch 5 is in its on state, a threshold voltage applied to the comparator 2 is equal to "$I_{dac} \cdot R4+V1$". Here, R4 denotes the resistance of the resistor 48, and V1 denotes a voltage generated by the constant voltage source 6. In this case, since the current $I_{dac}$ is given as "$I_{dac} = V_{dac} \cdot R1/\{R3 \cdot (R1+R2)\}$", the threshold voltage is equal to "$V_{dac} \cdot R1 \cdot R4/\{R3 \cdot (R1+R2)\}+V1$". When the analog switch 4 is in its on state and the analog switch 5 is in its off state, the threshold voltage applied to the comparator 2 is equal to "V1".

In the above-mentioned structure, the reason why the reference voltage is taken out from the fixed tap in the D/A converter 32a is as follows. The buffers 41 and 42 and the operational amplifier 43 in the voltage-to-current converter 40 use VDD as a power supply. In an ordinary operational amplifier or others, the output voltage thereof can not be set up to a power supply voltage. Accordingly, a tap voltage, which is lower than VDD by a voltage amount required in view of a dynamic range of an operational amplifier, is made as a maximum voltage.

The feed of the reference voltage from the D/A converter 32a to the voltage-to-current converter 40 prevents the operational amplifier 43 from being saturated. Accordingly, a dynamic range of the operational amplifier 43 is suitably maintained.

Fourth Embodiment

Figure 6:
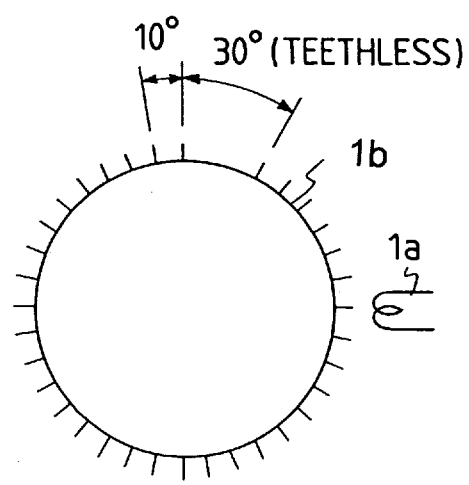
FIG. 6 is a diagram of a sensor.

As shown in FIG. 6, a sensor 1 such as a crank angle sensor includes a fixed pickup coil 1a and a rotatable gear-like member 1b. Rotation of the gear-like member 1b causes a sensor signal to be outputted. The pickup coil 1a is located near a part of the outer circumferential edge of the gear-like member 1b. Basically, teeth are arranged on the outer circumferential edge of the gear-like member 1b at equal angular intervals, for example, 10°.

A signal induced across the pickup coil 1a changes as every tooth on the gear-like member 1b passes through a region near the pickup coil 1a. Thus, the signal induced across the pickup coil 1a has a frequency proportional to the speed of rotation of the gear-like member 1b. The signal induced across the pickup coil 1a is used as an output signal of the sensor 1.

Figure 7:
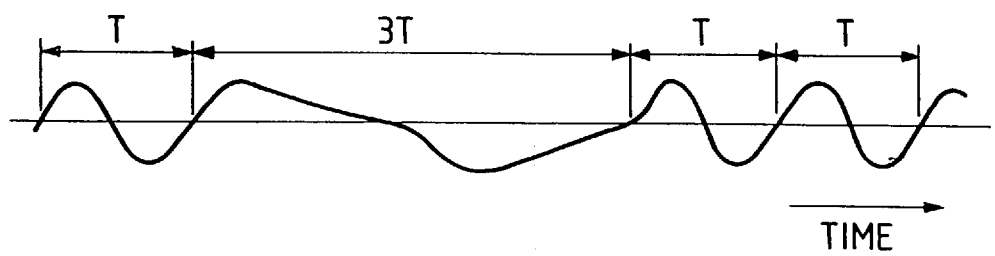
FIG. 7 is a time-domain diagram of the output signal from the sensor in FIG. 6.

It is now assumed that the outer circumferential edge of the gear-like member 1b has a teethless area (a teeth-missing area) with an angular dimension corresponding to 30°. In this case, the period of the output signal of the sensor 1 varies or fluctuates even during rotation of the gear-like member 1b at a constant speed. Specifically, as shown in FIG. 7, the period of the output signal of the sensor 1 which corresponds to the teethless area of the gear-like member 1b is three times the period related to the other area (the normal area) of the gear-like member 1b. As will be described later, a countermeasure is provided to prevent such a variation in the period of the output signal of the sensor 1 from adversely affecting the control of a threshold voltage.

FIG. 8 shows a portion of a fourth embodiment of this invention which is similar to the embodiment of FIGS. 2 and 3(a)–3(g), the embodiment of FIG. 4, or the embodiment of FIG. 5 except for design changes indicated hereinafter.

In the embodiment of FIG. 8, a missing-teeth detector 50 receives the output signal of a comparator 2. The missing-teeth detector 50 is sequentially followed by a delay circuit 60, an inverter 61, and an AND circuit 62. An edge detector 26 is connected to the clock terminal of an n-bit D-type flip flop (D-F/F) 27 via the AND circuit 62. The AND circuit 62 is closed and opened in response to the output signal of the inverter 61 which originates from the output signal of the missing-teeth detector 50.

The missing-teeth detector 50 senses a longer period of the output signal of the comparator 2 as an indication of the fact that a teethless area of the gear-like member 1b is passing through a region near the pickup coil 1a in the sensor 1. When the missing-teeth detector 50 senses a longer period of the output signal of the comparator 2, that is, when the missing-teeth detector 50 senses a teethless area of the gear-like member 1b, the missing-teeth detector 50 generates a gate closing signal. The gate closing signal is transmitted from the missing-teeth detector 50 to the AND circuit 62 via the delay circuit 60 and the inverter 61. The AND circuit 62 is closed by the gate closing signal. In the case where the AND circuit 62 is closed, the edge detector 26 is inhibited from enabling the D-type flip flop 27 to latch the output signal of the counter 23 upon the occurrence of every rising edge in the output signal of the comparator 2. Accordingly, in this case, the updating of the output signal of the D-type flip flop 27 is inhibited. Thus, it is possible to prevent the output signal of the D-type flip flop 27 from being adversely affected by the output signal of the comparator 2 which occurs in response to the teethless area of the gear-like member 1b in the sensor 1.

FIG. 9(a) shows an example of the waveform of the output signal of the comparator 2. As shown in the portion (a) of FIG. 9, the period of the output signal of the comparator 2 which corresponds to a teethless area of the gear-like member 1b in the sensor 1 is longer than that related to the other area (the normal area) of the gear-like member 1b. FIG. 9(a), the teethless-area-related period is denoted by the character T4 while the normal-area-related period is denoted by the characters T1, T2, T3, T5, and T6. FIG. 9(b) shows an example of the waveform of the output signal of the missing-teeth detector 50. With reference to FIG. 9(a) and FIG. 9(b), the missing-teeth detector 50 outputs a pulse in a later part of every teeth-area-related interval (for example, the teeth-area-related period T4). The pulse outputted from the missing-teeth detector 50 is delayed by the device 60, being inverted by the device 61 before reaching the AND circuit 62 as a gate closing pulse. The AND circuit 62 is closed by the gate closing pulse. FIG. 9(c) shows an example of the waveform of the output signal of the edge detector 26. With reference to FIG. 9(a) and FIG. 9(c), the edge detector 26 outputs a pulse at the moment of the occurrence of every rising edge in the output signal of the comparator 2. FIG. 9(d) shows an example of the waveform of the output signal of the AND circuit 62 which is applied to the D-type flip flop 27. With reference to FIG. 9(a), FIG. 9(c) and FIG. 9(d) under normal conditions, every pulse outputted from the edge detector 26 is transmitted to the D-type flip flop 27 via the AND circuit 62. On the other hand, a pulse outputted from the edge detector 26 at the end of every teethless-area-related interval (for example, the teeth-area-related period T4) is inhibited from reaching the D-type flip flop 27 since the AND circuit 62 is closed. Accordingly, at this time, the updating of the output signal of the D-type flip flop 27 is inhibited. FIG. 9(e) shows an example of a time-domain change in the pulse number represented by the output signal of the D-type flip flop 27. FIG. 9(e), the pulse number represented by the output signal of the D-type flip flop 27 changes as "n1", "n2", "n3", and "n5". With reference to FIG. 9(a) and FIG. 9(e), the pulse numbers n1, n2, n3, and n5 correspond to the normal-area-related intervals T1, T2, T3, and T5 respectively. The pulse number represented by the output signal of the D-type flip flop 27 is prevented from reflecting the teethless-area-related interval T4.

Figure 10:
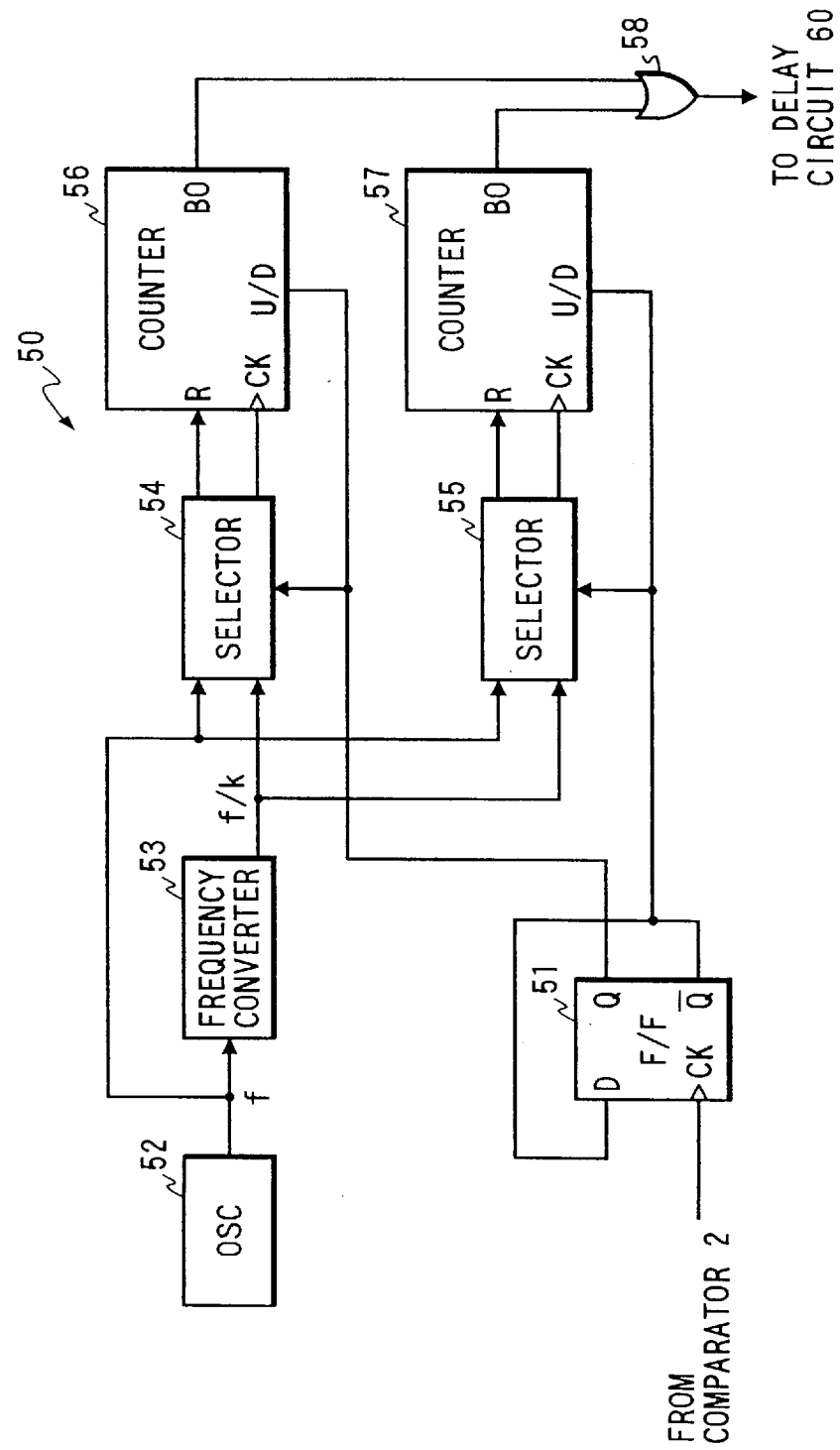
FIG. 10 is a block diagram of an edge detector in FIG. 8.

As shown in FIG. 10, the missing-teeth detector 50 includes a D-type flip flop (D-F/F) 51, an oscillator 52, a frequency converter 53, selectors 54 and 55, counters 56 and 57, and an OR circuit 58. The clock terminal of the D-type flip flop 51 is subjected to the output signal of the comparator 2 (see FIG. 8). The D input terminal of the D-type flip flop 51 is connected to the inverting output terminal thereof. The non-inverting output terminal of the D-type flip flop 51 is connected to the control terminal of the selector 54 and the up/down selection terminal of the counter 56. The inverting output terminal of the D-type flip flop 51 is connected to the control terminal of the selector 55 and the up/down selection terminal of the counter 57. The output terminal of the oscillator 52 is connected to the input terminal of the frequency converter 53. The output terminal of the oscillator 52 is also connected to first input terminals of the selectors 54 and 55. The output terminal of the frequency converter 53 is connected to second input terminals of the selectors 54 and 55. Output terminals of the selector 54 are connected to the clock terminal and the reset terminal of the counter 56 respectively. Output terminals of the selector 55 are connected to the clock terminal and the reset terminal of the counter 57 respectively. The BO output terminal of the counter 56 is connected to a first input terminal of the OR circuit 58. The BO output terminal of the counter 57 is connected to a second input terminal of the OR circuit 58. The output terminal of the OR circuit 58 is followed by the delay circuit 60 (see FIG. 8).

The oscillator 52 outputs a fixed-frequency clock signal to the frequency converter 53 and the selectors 54 and 55. The clock signal outputted from the oscillator 52 has a frequency "f" of, for example, 80 KHz. The clock signal outputted from the oscillator 52 is referred to as the first clock signal. The frequency converter 53 changes the first clock signal into a second clock signal having a frequency given as "f/k", where "k" denotes a given value which can be selected from among, for example, "2", "2.2", and "2.4". Accordingly, the frequency of the second clock signal is lower than the frequency of the first clock signal. The frequency converter 53 outputs the second clock signal to the selectors 54 and 55. The first clock signal is used by the counters 56 and 57 in up-counting processes. The second clock signal is used by the counters 56 and 57 in down-counting processes.

The device 54 selects one of the first and second clock signals in response to the non-inverting output signal from the D-type flip flop 51. The selector 54 outputs the selected clock signal to the counter 56. The device 55 selects one of the first and second clock signals in response to the inverting output signal from the D-type flip flop 51. The selector 55 outputs the selected clock signal to the counter 57. When the device 54 selects the first clock signal, the device 55 selects the second clock signal. When the device 54 selects the second clock signal, the device 55 selects the first clock signal. The selector 54 outputs a reset pulse to the counter 56 when the signal selected by the device 54 changes from the second clock signal to the first clock signal. The selector 55 outputs a reset pulse to the counter 57 when the signal selected by the device 55 changes from the second clock signal to the first clock signal.

The device 56 counts pulses in the output signal of the selector 54. Operation of the counter 56 is changed between an up-count mode and a down-count mode in response to the non-inverting output signal from the D-type flip flop 51. When the output signal of the selector 54 is equal to the first clock signal, the operation of the counter 56 is in the up-count mode. When the output signal of the selector 54 is equal to the second clock signal, the operation of the counter 56 is in the down-count mode. The device 57 counts pulses in the output signal of the selector 55. Operation of the counter 57 is changed between an up-count mode and a down-count mode in response to the inverting output signal from the D-type flip flop 51. When the output signal of the selector 55 is equal to the first clock signal, the operation of the counter 57 is in the up-count mode. When the output signal of the selector 55 is equal to the second clock signal, the operation of the counter 57 is in the down-count mode. The operation of the counter 56 alternates between the up-count mode and the down-count mode. The operation of the counter 57 alternates between the up-count mode and the down-count mode. In the case where the operation of the counter 56 is in the up-count mode, the operation of the counter 57 is in the down-count mode. In the case where the operation of the counter 56 is in the down-count mode, the operation of the counter 57 is in the up-count mode.

FIG. 11(a) shows an example of the waveform of the output signal of the comparator 2. FIG. 11(b) shows an example of a time-domain variation in the counted pulse number provided by the counter 56 or the counter 57. With reference to FIG. 11(a) and 11(b), the operation of the counter 56 (or the counter 57) changes from one of the up-count mode and the down-count mode to the other at the moment of the occurrence of every rising edge in the output signal of the comparator 2. Each time the operation of the counter 56 (or the counter 57) changes from the down-count mode to the up-count mode, the counted pulse number provided by the counter 56 (or the counter 57) is reset to an initial number equal to "0". FIG. 11(c) shows an example of the waveform of the BO output signal from the counter 56 (or the counter 57). With reference to FIG. 11(a), FIG. 11(b), and FIG. 11(c), during a longer period of the output signal of the comparator 2 which corresponds to a teethless-area-related period (a teethless-area-related interval), the counted pulse number represented by the signal in one of the counters 56 and 57 operating in the down-count mode decreases to "0" so that the BO output signal therefrom changes from a low-level state to a high-level state. When the teethless-area-related period (the teethless-area-related interval) ends, the operation of the counter in question changes to the up-count mode and hence the related pulse number increases from "0". Accordingly, at this time, the BO output signal returns to the low-level state. In this way, one of the counters 56 and 57 outputs a high-level signal during a later part of every teeth-area-related period (every teethless-area-related interval). The high-level signal is transmitted from the related counter to the delay circuit 60 via the OR circuit 58.

What is claimed is:
1. A waveform shaping apparatus comprising:
a) comparing means for comparing a sensor output signal with a threshold voltage to convert the sensor output signal into a waveform shaped signal, and outputting the waveform shaped signal; and
b) frequency-to-voltage converting means for generating the threshold voltage in response to a frequency of the output signal from the comparing means;
wherein the frequency-to-voltage converting means comprises:
b1) clock signal generating means for generating a clock signal in response to the output signal from the comparing means, the clock signal having a period proportional to a period of the output signal from the comparing means;,
b2) first counting means for counting pulses in the clock signal generated by the clock signal generating means for every given period, and outputting a signal representing a counted pulse number depending on the frequency of the output signal from the comparing means;
b3) D/A converting means for converting the output signal from the first counting means into a voltage signal which depends on the counted pulse number; and
b4) means for generating the threshold voltage in response to the voltage signal generated by the D/A converting means.

2. The waveform shaping apparatus of claim 1, wherein the clock signal generating means comprises period measuring means for measuring a period of the output signal from the comparing means, and converting means for generating the clock signal in response to the period measured by the period measuring means.

3. The waveform shaping apparatus of claim 2, wherein the period measuring means comprises edge detecting means for detecting every edge in the output signal from the comparing means, second counting means for counting pulses in a fixed-frequency signal during a time interval between moments at which a last edge and an immediately preceding edge are detected by the edge detecting means respectively, the period measuring means being operative for measuring the period of the output signal from the comparing means in response to a counted pulse number related to the second counting means.

4. The waveform shaping apparatus of claim 3, wherein the period measuring means further comprises averaging means for averaging a plurality of last counted pulse numbers related to the second counting means into an average counted pulse number, the period measuring means being operative for measuring the period of the output signal from the comparing means in response to the average counted pulse number.

5. The waveform shaping apparatus of claim 2, wherein the sensor output signal is generated in response to rotation of a rotatable member having teeth, and further comprising missing-teeth detecting means for detecting a teethless area of the rotatable member in response to the output signal from the comparing means, and means for inhibiting the period measured by the period measuring means from being updated when a teethless area is detected by the missing-teeth detecting means.

6. The waveform shaping apparatus of claim 2, wherein the converting means comprises third counting means for counting pulses in a fixed-frequency signal having a period shorter than the given period, and means for comparing the period measured by the period measuring means and a counted pulse number related to the third counting means to generate the clock signal.

7. A waveform shaping apparatus comprising:
 a) comparing means for comparing a sensor output signal with a threshold voltage to convert the sensor output signal into a waveform shaped signal, and outputting the waveform shaped signal; and
 b) frequency-to-voltage converting means for generating the threshold voltage in response to a frequency of the output signal from the comparing means;

wherein the frequency-to-voltage converting means comprises:
 b1) clock signal generating means for generating a clock signal in response to the output signal from the comparing means, the clock signal having a period proportional to a period of the output signal from the comparing means;
 b2) counting means for down-counting pulses in the clock signal generated by the clock signal generating means from an initial value for every given period, and outputting a signal representing a down-counted pulse number depending on the frequency of the output signal from the comparing means;
 b3) a D/A converting means for converting the output signal from the counting means into a voltage signal, the D/A converting means comprising means for generating a given reference voltage;
 b4) voltage-to-current converting means for converting a voltage difference between the voltage signal and the given reference voltage generated by the D/A converting means into a corresponding current signal; and
 b5) means for generating the threshold voltage in response to the current signal generated by the voltage-to-current converting means.

* * * * *